United States Patent
Choi et al.

(10) Patent No.: US 8,785,257 B2
(45) Date of Patent: Jul. 22, 2014

(54) ARRAY SUBSTRATE FOR DISPLAY DEVICE

(75) Inventors: Hee-Dong Choi, Seosan-si (KR); Hye-Young Choi, Seoul-si (KR); Doo-Seok Yang, Incheon (KR)

(73) Assignee: LG Display Co., Ltd., Seoul (KR)

( * ) Notice: Subject to any disclaimer, the term of this patent is extended or adjusted under 35 U.S.C. 154(b) by 153 days.

(21) Appl. No.: 12/829,705

(22) Filed: Jul. 2, 2010

(65) Prior Publication Data
US 2011/0108846 A1 May 12, 2011

(30) Foreign Application Priority Data

Nov. 11, 2009 (KR) .................. 10-2009-0108550

(51) Int. Cl.
*H01L 21/00* (2006.01)
*H01L 27/12* (2006.01)
*H01L 29/786* (2006.01)

(52) U.S. Cl.
CPC ............ *H01L 27/1214* (2013.01); *H01L 27/12* (2013.01); *H01L 29/78648* (2013.01)
USPC ................. 438/149; 349/42; 349/43; 349/44; 349/45; 349/46

(58) Field of Classification Search
USPC ....................... 438/149; 349/42–46
See application file for complete search history.

(56) References Cited

U.S. PATENT DOCUMENTS

| | | | | |
|---|---|---|---|---|
| 4,942,441 | A * | 7/1990 | Konishi et al. | 257/351 |
| 6,812,489 | B2 * | 11/2004 | Kawachi et al. | 257/59 |
| 7,847,291 | B2 * | 12/2010 | Yoon et al. | 257/59 |
| 7,947,539 | B2 * | 5/2011 | You | 438/149 |
| 2007/0273291 | A1 * | 11/2007 | Choi et al. | 315/158 |
| 2008/0044982 | A1 | 2/2008 | You | |

FOREIGN PATENT DOCUMENTS

| | | |
|---|---|---|
| CN | 1599524 | 3/2005 |
| CN | 1619392 | 5/2005 |
| CN | 2717021 | 8/2005 |
| CN | 1716632 | 1/2006 |

\* cited by examiner

*Primary Examiner* — David Vu
*Assistant Examiner* — Brandon Fox
(74) *Attorney, Agent, or Firm* — McKenna Long & Aldridge LLP

(57) ABSTRACT

Disclosed is array substrate including a pixel region having a switching region, a driving region and a storage region. A switching TFT in the switching region includes a first gate electrode, a first gate insulating layer, a switching active layer on the first gate insulating layer, a switching source electrode on a first switching ohmic contact layer, and a switching drain electrode on a second switching ohmic contact layer; a driving TFT in the driving region is connected to the switching TFT and includes a first gate electrode, a second gate insulating layer, a driving active layer on the second gate insulating layer, a driving source electrode on a first driving ohmic contact layer, and a driving drain electrode on a second driving ohmic contact layer; wherein at least one of the switching and driving TFTs further includes a second gate electrode over the switching or driving active layers.

34 Claims, 11 Drawing Sheets dry-etching

_US 8,785,257 B2_

ARRAY SUBSTRATE FOR DISPLAY DEVICE

This application claims the benefit of Korean Patent Application No. 2009-0108550, filed on Nov. 11, 2009, which is hereby incorporated by reference for all purposes as if fully set forth therein.

BACKGROUND OF THE INVENTION

1. Field of the Invention

The present invention relates to an array substrate for a display device, and more particularly, to an array substrate for a display device that includes a thin film transistor having excellent properties.

2. Discussion of the Related Art

As society has entered the information age, a field of display devices that represents all sorts of electrical signals as visual images has rapidly developed. Particularly, the liquid crystal display (LCD) device or the Organic Electroluminescent Display (OELD) device as a flat panel display device having characteristics of light weight, thinness and low power consumption has developed to be used as a substitute for a display device of a cathode-ray tube type.

Because the LCD device, including a thin film transistor (TFT) as a switching element, referred to as an active matrix LCD (AM-LCD) device, has excellent characteristics such as high resolution and displaying moving images, the AM-LCD device has been widely used.

OELD devices also have excellent characteristics such high brightness, a low power consumption and high contrast ratio, and have also been widely used. Moreover, the OELD device offers the advantages of a high response rate, and a low production cost.

Both the LCD device and the OELD device require an array substrate including a thin film transistor (TFT) as a switching element for controlling on and off of each pixel region. In addition, the OELD device requires another TFT as a driving element for driving an organic electroluminescent diode in each pixel region.

FIG. 1 is a cross-sectional view of a portion of the related art array substrate for an OELD device. For convenience of explanation, a region, where a driving TFT is formed, is defined as a driving region TrA.

In FIG. 1, the array substrate includes a substrate 11 including a pixel region P and the driving region TrA. On the substrate 11, a gate line (not shown) and a data line 33 are formed to define the pixel region P. The gate line and the data line 33 cross each other to define the pixel region. In the driving region TrA in the pixel region P, a gate electrode 15 is formed, and a gate insulating layer 18 covers the gate electrode 15. A semiconductor layer 28 including an active layer 22 and an ohmic contact layer 26 is formed on the gate insulating layer 18 and in the driving region TrA. The active layer 22 is formed of intrinsic amorphous silicon, and the ohmic contact layer 26 is formed of impurity-doped amorphous silicon. A source electrode 36 and a drain electrode 38, which is spaced apart from the source electrode 36, are formed on the semiconductor layer 28. A portion of the ohmic contact layer 26 corresponding to a space between the source and drain electrodes 36 and 38 is removed such that a center of the active layer 22 is exposed through the space between the source and drain electrodes 36 and 38.

The gate electrode 15, the gate insulating layer 18, the semiconductor layer 28, the source electrode 36 and the drain electrode 38 constitute the driving TFT Tr. Although not shown, a switching TFT having substantially the same structure as the driving TFT Tr is formed in the pixel region P. The switching TFT is connected to the gate line, the data line 33 and the driving TFT Tr.

A passivation layer 42 including a drain contact hole 45 is formed on the driving TFT Tr. The drain contact hole 45 exposes the drain electrode 38 of the driving TFT Tr. A pixel electrode 50 contacting the drain electrode 38 of the driving TFT Tr is formed on the passivation layer 42 and in each pixel region P. A semiconductor pattern 29 including a first pattern 27, which is formed of the same material and disposed on the same layer as the ohmic contact layer 26, and a second pattern 23, which is formed of the same material and disposed on the same layer as the active layer 22, is disposed under the data line 33.

The active layer 22 has a difference in a thickness. Namely, a center portion, which is exposed through the space between the source and drain electrodes 36 and 38, of the active layer 22 has a first thickness t1, and a side portion, on which the ohmic contact layer 26 is formed, of the active layer 22 has a second thickness t2 being different from the first thickness t1. (t1≠t2) The thickness difference in the active layer 22 is caused by a fabricating method. Properties of the TFT are degraded by the thickness difference in the active layer 22.

FIG. 2 is a cross-sectional view showing a process for forming the semiconductor layer, the source electrode and the drain electrode in the related art array substrate. For convenience of explanation, the gate electrode and the gate insulating layer are not shown.

In FIG. 2, an intrinsic amorphous silicon layer (not shown), an impurity-doped amorphous silicon layer (not shown), and a metal layer (not shown) are sequentially formed on the substrate 11. The metal layer, the impurity-doped amorphous silicon layer and the intrinsic amorphous silicon layer are patterned to form a metal pattern (not shown), an impurity-doped amorphous silicon pattern (not shown) under the metal pattern, and an intrinsic amorphous silicon pattern (not shown) under the impurity-doped amorphous silicon pattern.

Next, a center portion of the metal pattern is etched to form the source electrode 36 and the drain electrode 38 spaced from the source electrode 36. By etching the metal pattern, a center portion of the impurity-doped amorphous silicon pattern is exposed through the space between the source electrode 36 and the drain electrode 38.

Next, the exposed center portion of the impurity-doped amorphous silicon pattern is dry-etched to form the ohmic contact layer 26 under the source electrode 36 and the drain electrode 38. In this case, the dry-etching process for the exposed center portion of the impurity-doped amorphous silicon pattern is performed for a duration of time to completely remove the exposed center portion of the impurity-doped amorphous silicon pattern. By dry-etching the exposed center portion of the impurity-doped amorphous silicon pattern, a center portion of the active layer 22 of intrinsic amorphous silicon is partially etched. However, a side portion of the active layer 22 is not etched because the ohmic contact layer 26 blocks the side portion of the active layer 22. As a result, the active layer 22 has a difference in thickness (t1≠t2).

If the dry-etching process for the exposed center portion of the impurity-doped amorphous silicon pattern is not performed for the above duration of time to avoid the difference in thickness, the impurity-doped amorphous silicon may remain on the active layer 22 such that properties of the TFT are reduced. Accordingly, it is required to perform the dry-etching process for the exposed center portion of the impurity-doped amorphous silicon pattern for the duration of time.

Accordingly, in the above fabricating process for the related art array substrate, the thickness difference in the active layer is an inevitable result such that properties of the TFT are not reduced.

In addition, since the intrinsic amorphous silicon layer for the active layer should be formed with a sufficient thickness, for example, more than about 1000 Å, considering etched thickness, production yield is reduced and production cost is increased.

Generally, the active layer for the TFT is formed of intrinsic amorphous silicon. Since atoms of intrinsic amorphous silicon are randomly arranged, it has a metastable state with light or an electric field such that there is a problem in stability as a TFT. In addition, since a carrier mobility in a channel is relatively low, i.e., 0.1 $cm^2/V \cdot S \sim 1.01$ $cm^2/V \cdot S$, there is a limitation in use of a driving element.

To resolve these problems, a fabricating method of a thin film transistor, which includes an active layer of polycrystalline silicon by crystallizing amorphous silicon into polycrystalline silicon through a crystallizing process with a laser beam apparatus, is introduced.

However, referring to FIG. 3, which shows a cross-sectional view of the related art array substrate including the active layer of polycrystalline silicon, a doping process is required. Namely, in the array substrate 51 including the TFT Tr, high concentration impurities should be doped into both sides of the center region 55a of the semiconductor layer 55 of polycrystalline silicon to form n+ region 55b. The region 55b may be p+ region depending on a kind of the impurities. Accordingly, an implantation apparatus for the doping process is required, so a new process line is required and production costs are thus increased.

SUMMARY OF THE INVENTION

Accordingly, the present invention is directed to an array substrate for a display device that substantially obviates one or more of the problems due to limitations and disadvantages of the related art.

An advantage of the present invention is to provide an array substrate including a thin film transistor having improved properties.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a display device includes a substrate having a pixel region, the pixel region including a switching region, a driving region and a storage region; a gate line, a data line and a power line on the substrate, the gate and data lines crossing each other to define the pixel region; a switching thin film transistor (TFT) on the substrate and arranged in the switching region, the switching TFT connected to the gate and data lines and including a first switching gate electrode, a switching gate insulating layer on the first switching gate electrode, a switching active layer of an intrinsic polycrystalline silicon on the switching gate insulating layer, first and second switching ohmic contact layers contacting the switching active layer, a switching source electrode on the first switching ohmic contact layer, and a switching drain electrode on the second switching ohmic contact layer; a driving TFT on the substrate and arranged in the driving region, the driving TFT connected to the switching TFT and the power line and including a first driving gate electrode, a driving gate insulating layer on the first driving gate electrode, a driving active layer of intrinsic polycrystalline silicon on the driving gate insulating layer, first and second driving ohmic contact layers contacting the driving active layer, a driving source electrode on the first driving ohmic contact layer, and a driving drain electrode on the second driving ohmic contact layer; a pixel electrode connected to the driving drain electrode and disposed in the pixel region, and wherein the switching TFT further includes a second switching gate electrode over the switching active layer.

In another aspect of the present invention, an array substrate for a display device includes gate and data lines on a substrate including a pixel region and crossing each other to define the pixel region; a thin film transistor (TFT) on the substrate and connected to the gate and data lines, the TFT including a first gate electrode, a gate insulating layer on the first gate electrode, an active layer of intrinsic polycrystalline silicon on the gate insulating layer, first and second ohmic contact layers contacting the active layer, a source electrode on the first ohmic contact layer, a drain electrode on the second ohmic contact layer, and a second gate electrode over the active layer; and a pixel electrode connected to the drain electrode and disposed in the pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments, examples of which are illustrated in the accompanying drawings.

Figure 1:
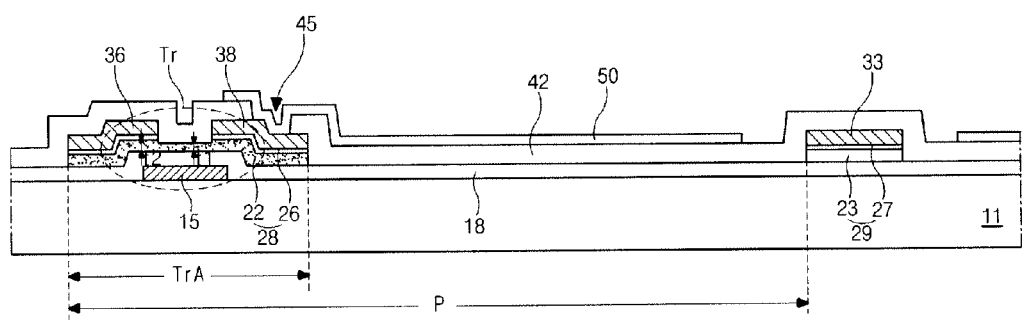
FIG. 1 is a cross-sectional view of a portion of the related art array substrate for the OELD device.
Figure 2:
FIG. 2 is a cross-sectional view showing a process for forming the semiconductor layer, the source electrode and the drain electrode in the related art array substrate.
Figure 2:
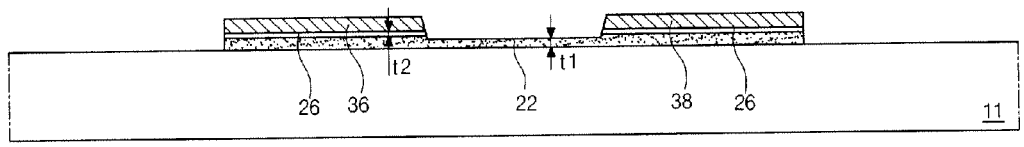
Figure 3:
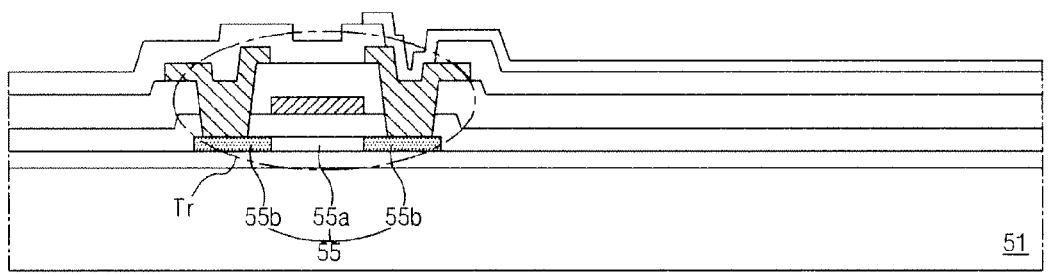
FIG. 3 is a cross-sectional view of the related art array substrate including the active layer of polycrystalline silicon.
Figure 4:
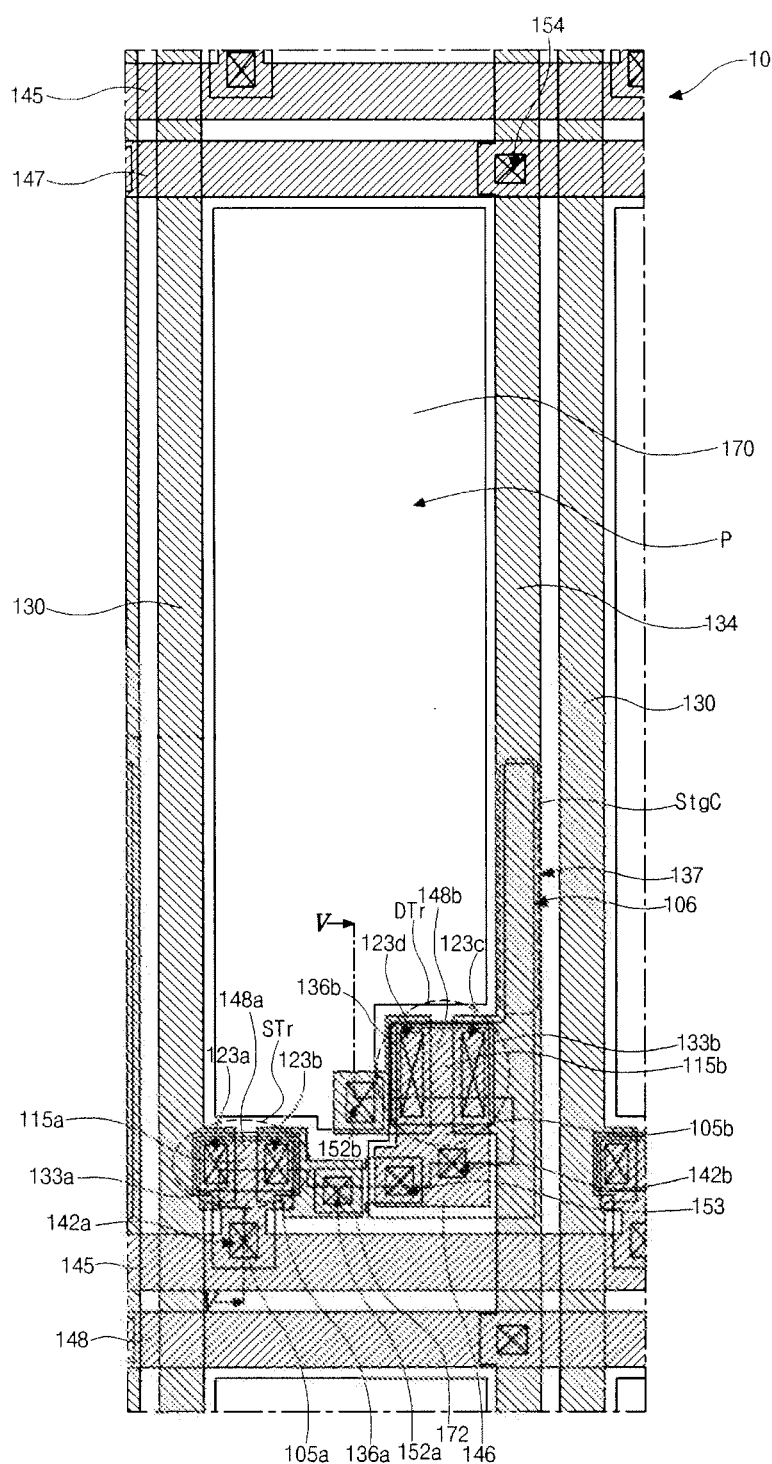
FIG. 4 is a plane view showing one pixel region of an array substrate for an OELD device according to the present invention.

FIG. 4 is a plane view showing one pixel region of an array substrate for an OELD device according to the present invention.

In FIG. 4, on a substrate 101 of the array substrate, gate and data lines 145 and 130, which cross each other to define a pixel region P, are disposed. A first power line 134, which is parallel to the data line 130, is disposed on the substrate 101. In addition, a second power line 147, which is connected to the first power line 134 through a power contact hole 154, is parallel to and spaced apart from the gate line 145.

In the pixel region P, a switching TFT STr and a driving TFT DTr are disposed. In the present invention, at least one of the switching TFT STr and the driving TFT DTr includes a dual type gate electrode. In FIG. 4, both the switching TFT STr and the driving TFT DTr include a dual type gate electrode.

The switching TFT STr includes a first switching gate electrode 105a, a second switching gate electrode 148a, a switching active layer 115a, a first switching ohmic contact layer (not shown), a second switching ohmic contact layer (not shown), a switching source electrode 133a and a switching drain electrode 136a.

The first switching gate electrode 105a of the switching TFT STr is connected to the gate line 145 through a first gate contact hole 142a, and the second switching gate electrode 148a of the switching TFT STr extends from the gate line 145. The second switching gate electrode 148a overlaps the switching source electrode 133a of the switching TFT STr and the switching drain electrode 136a of the switching TFT STr and a space between the switching source electrode 133a and the switching drain electrode 136a. The switching source electrode 133a extends from the data line 130 and is spaced apart from the switching drain electrode 136a.

The first and second switching ohmic contact layer contacts the switching active layer 115a through first and second active contact holes 123a and 123b, respectively. The switching source electrode 133a is disposed on the first switching ohmic contact layer, and the switching drain electrode 136a is disposed on the second switching ohmic contact layer.

The driving TFT DTr includes a first driving gate electrode 105b, a second driving gate electrode 148b, a driving active layer 115b, a first driving ohmic contact layer (not shown), a second driving ohmic contact layer (not shown), a driving source electrode 133b and a driving drain electrode 136b.

An gate auxiliary pattern 146 contacting the first driving gate electrode 105b through a second gate contact hole 142b, which exposes the first driving gate electrode 105b, is disposed in the pixel region P. In addition, a gate connection electrode 172, which contacts the switching drain electrode 136a through a first drain contact hole 152a and the gate auxiliary pattern 146 through an auxiliary pattern contact hole 153, is disposed between the switching drain electrode 136a and the gate auxiliary pattern 146. As a result, the switching drain electrode 136a is electrically connected to the first driving gate electrode 105b through the gate connection electrode 172 and the gate auxiliary pattern 146. The second driving gate electrode 148b extends from the gate auxiliary pattern 146. The second driving gate electrode 148b overlaps the driving source electrode 133b of the driving TFT DTr and the driving drain electrode 136b of the driving TFT DTr and a space between the driving source electrode 133b and the driving drain electrode 136b. The driving source electrode 133b extends from the first power line 134 and is spaced apart from the driving drain electrode 136b.

The first and second driving ohmic contact layer contacts the driving active layer 115b through third and fourth active contact holes 123c and 123d, respectively. The driving source electrode 133b is disposed on the first driving ohmic contact layer, and the driving drain electrode 136b is disposed on the second driving ohmic contact layer.

A pixel electrode 170, which is connected to the driving drain electrode 136b through a second drain contact hole 152b, is disposed in the pixel region P. The first driving gate electrode 105b extends to overlap the first power line 134. The overlapped portion of the first driving gate electrode 105b serves as a first storage electrode 106, the overlapped portion of the first power line 134 serves as a second storage electrode 137, and a gate insulating layer (not shown) and an interlayer insulating layer (not shown) between the first and second storage electrodes 106 and 137 serve as a dielectric material layer. The first storage electrode 106, the second storage electrode 137 and the gate insulating layer and the interlayer insulating layer form a storage capacitor StgC.

Figure 5:
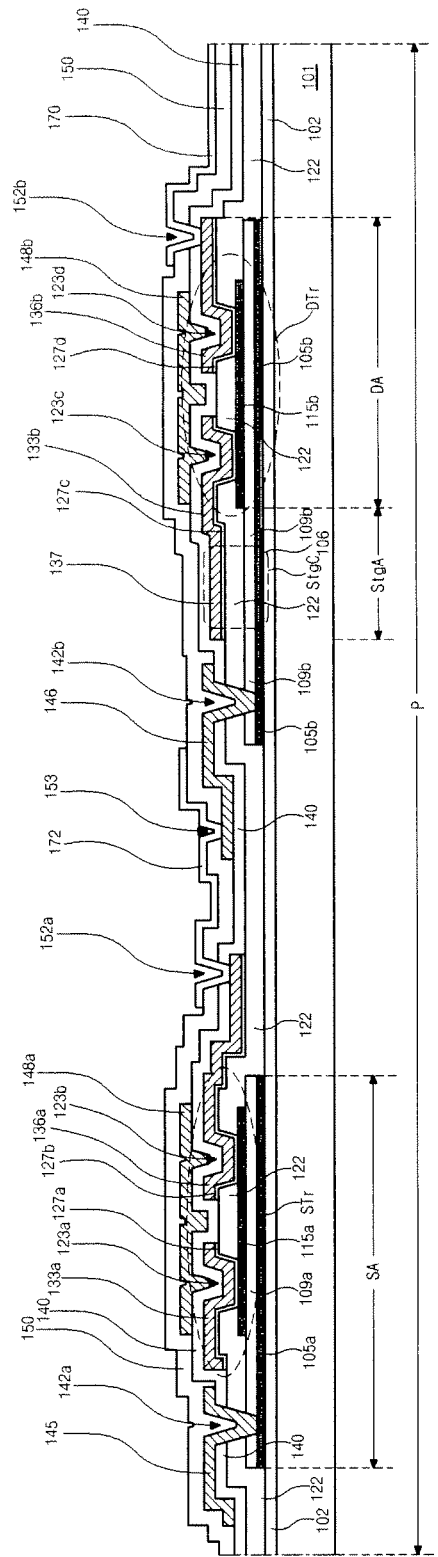
FIG. 5 is a cross-sectional view taken along the line V-V of FIG. 4.

FIG. 5 is a cross-sectional view taken along the line V-V of FIG. 4. For convenience of explanation, a switching region SA, where the switching TFT STr is disposed, a driving region DA, where the driving TFT DTr is disposed, and a storage region StgA, where the storage capacitor StgC is disposed, are defined.

Referring to FIG. 5 in conjunction with FIG. 4, a buffer layer 102 of an inorganic insulating material or an organic insulating material is disposed on the substrate 101. For example, the inorganic insulating material may include silicon oxide or silicon nitride, and the organic insulating material may include photo-acryl or benzocyclobutene (BCB). The buffer layer 102 has a thickness of about 1000 Å to about 5000 Å.

The first switching gate electrode 105a is disposed on the buffer layer 102 and in the switching region SA. The first driving gate electrode 105b is disposed on the buffer layer 102 and in the driving region DA. For example, each of the first switching gate electrode 105a and the first driving gate electrode 105b is formed of impurity-doped polycrystalline silicon. Alternatively, each of the first switching gate electrode 105a and the first driving gate electrode 105b may be formed of a metallic material having a high melting point greater than about 800° C. For example, the metallic material for each of the first switching gate electrode 105a and the first driving gate electrode 105b may include one of titanium (Ti), tungsten (Tw), a molybdenum alloy such as molybdenum-titanium alloy (MoTi), molybdenum (Mo), tantalum (Ta), copper (Cu), Cu alloy and a combination thereof. When each of the first switching gate electrode 105a and the first driving gate electrode 105b is formed of impurity-doped polycrystalline silicon, a thickness of each of the first switching gate electrode 105a and the first driving gate electrode 105b is about 500 to about 1000 Å. When each of the first switching gate electrode 105a and the first driving gate electrode 105b is formed of the above metallic material, a thickness of each of the first switching gate electrode 105a and the first driving gate electrode 105b is about 100 Å to about 1000 Å, beneficially, about 100 Å to about 500 Å.

The first driving gate electrode 105b extends into the storage region StgA to form the first storage electrode 106. Namely, a portion of the first driving gate electrode 105 is defined as the first storage electrode 106.

A switching gate insulating layer 109a is disposed on the first switching gate electrode 105a, and a driving gate insulating layer 109b is disposed on the first driving gate electrode 105b. Each of the first and second gate insulating layers 109a and 109b is formed of an inorganic insulating material or an organic insulating material. For example, the inorganic insulating material includes silicon oxide or silicon nitride, and the organic insulating material includes photo-acryl or BCB. The driving gate insulating layer 109b is also disposed on the first storage electrode 106. The switching gate insulating layer 109a has the same plane shape and plane area as the first switching gate electrode 105a such that the first switching insulating layer 109a perfectly overlaps the first switching gate electrode 105a. The driving gate insulating layer 109b has the same plane shape and plane area as the first driving gate electrode 105b such that the driving gate insulating layer 109b perfectly overlaps the first driving gate electrode 105b.

The switching active layer 115a is disposed on the switching gate insulating layer 109a and corresponds to the first switching gate electrode 105a. The driving active layer 115b is disposed on the driving gate insulating layer 109b and corresponds to the first driving gate electrode 105b. Namely, the switching active layer 115a and the driving active layer 115b are disposed in the switching region SA and the driving region DA, respectively. Each of the first and second active layers 115a and 15b is formed of intrinsic polycrystalline silicon.

The interlayer insulating layer 122 including first to fourth active contact holes 123a, 123b, 123c and 123d is disposed over an entire surface of the substrate 101 and on the switching and driving active layers 115a and 115b. The first and second active contact holes 123a and 123b respectively expose both sides of the switching active layer 115a, and the third and fourth active contact holes 123c and 123d respectively expose both sides of the driving active layer 115b. A portion of the interlayer insulating layer 122 corresponding to a center of each of the switching and driving active layers 115a and 115b serves as an etch-stopper. The interlayer insulating layer 122 is formed of an inorganic insulating material or an organic insulating material. For example, the inorganic insulating material includes silicon oxide or silicon nitride, and the organic insulating material includes photo-acryl or BCB.

The first and second switching ohmic contact layers 127a and 127b are disposed on the interlayer insulating layer 122 and in the switching region SA. The first and second switching ohmic contact layers 127a and 127b contact the switching active layer 115a through the first and second active contact holes 123a and 123b, respectively. The first and second driving ohmic contact layers 127c and 127d are disposed on the interlayer insulating layer 122 and in the driving region SA. The first and second driving ohmic contact layers 127c and 127d contact the driving active layer 115b through the third and fourth active contact holes 123c and 123d, respectively. The first and second switching ohmic contact layers 127a and 127b and the first and second driving ohmic contact layers 127c and 127d are formed of impurity-doped amorphous silicon.

The switching source electrode 133a is disposed on the first switching ohmic contact layer 127a, and the switching drain electrode 136a is disposed on the second switching ohmic contact layer 127b. The switching drain electrode 136a is spaced apart from the switching source electrode 133a. The driving source electrode 133b is disposed on the third driving ohmic contact layer 127c, and the driving drain electrode 136b is disposed on the second driving ohmic contact layer 127d. The driving drain electrode 136b is spaced apart from the driving source electrode 133b. The data line 130, which is connected to the switching source electrode 133a, is disposed over the interlayer insulating layer 122. Each of the switching source electrode 133a, the switching drain electrode 136a, the driving source electrode 133b, the driving drain electrode 136b and the data line 130 has a double-layered structure or a triple-layered structure.

In addition, the first power line 134, which is parallel to the data line 130, is disposed over the interlayer insulating layer 122. A portion of the first power line 134 overlaps the first storage electrode 106 to define the second storage electrode 137. The first storage electrode 106, the second storage electrode 137 and the second gate insulating layer 109b and the interlayer insulating layer 122 constitute a storage capacitor StgC.

A first passivation layer 140 is disposed on the switching source electrode 133a, the switching drain electrode 136a, the driving source electrode 133b, the driving drain electrode 136b and the data line 130. The first passivation layer 140 is formed of an inorganic insulating material or an organic insulating material. For example, the inorganic insulating material includes silicon oxide or silicon nitride, and the organic insulating material includes photo-acryl or BCB. The first passivation layer 140, and the interlayer insulating layer 122 and the first gate insulating layer 109a under the first passivation layer 140 are patterned to form the first gate contact hole 142a exposing a portion of the first switching gate electrode 105a. In addition, the first passivation layer 140, and the interlayer insulating layer 122 and the second gate insulating layer 109b under the first passivation layer 140 are patterned to form the second gate contact hole 142b exposing a portion of the first driving gate electrode 105b. In addition, a power contact hole 154 exposing the first power line 134 is formed through the first passivation layer 140.

The gate line 145, which is connected to the first switching gate electrode 105a through the first gate contact hole 142a, is disposed on the first passivation layer 140. The gate line 145 crosses the data line 130 to define the pixel region P. The second switching gate electrode 148a is disposed on the first passivation layer 140. The second switching gate electrode 148a extends from the gate line 145 and overlaps the switching source electrode 133a and the switching drain electrode 136a and a space between the switching source electrode 133a and the switching drain electrode 136a. Each of the second switching gate electrode 148a and the gate line 145 has a double-layered structure or a triple-layered structure.

The gate auxiliary pattern 146, which contacts the first driving gate electrode 105b through the second gate contact hole 142b, is disposed on the first passivation layer 140. The second driving gate electrode 148b is also disposed on the first passivation layer 140. The second driving gate electrode 148b extends from the gate auxiliary pattern 146 and overlaps the driving source electrode 133b and the driving drain electrode 136b and a space between the driving source electrode 133b and the driving drain electrode 136b. The second power line 147, which is parallel to and spaced apart from the gate line 145, is disposed on the first passivation layer 140. The second power line 147 is connected to the first power line 134 through the power contact hole 154.

FIG. 5 shows both the switching TFT STr and the driving TFT DTr including dual gate electrodes. Alternatively, only one of the switching TFT STr and the driving TFT DTr may include dual gate electrodes.

A second passivation layer 150 is disposed on the gate line 145, the gate auxiliary pattern 146, the second switching gate electrode 148a, the second driving gate electrode 148b, and the second power line 147. The second passivation layer 150 is formed of an inorganic insulating material or an organic insulating material. For example, the inorganic insulating material includes silicon oxide or silicon nitride, and the organic insulating material includes photo-acryl or BCB. The auxiliary pattern contact hole 153 is formed through the second passivation layer 150 to expose the gate auxiliary pattern 146. In addition, the first and second drain contact holes 152a and 152b are formed through the first and second passivation layers 140 and 150 to expose the switching drain electrode 136a and the driving drain electrode 136b, respectively.

The pixel electrode 170, which is connected to the driving drain electrode 136b through the second drain contact hole 152b, is disposed on the second passivation layer 150 and in each pixel region P. In addition, the gate connection electrode 172 for connecting the switching drain electrode 136a and the gate auxiliary pattern 146 is disposed on the second passivation layer 150. One end of the gate connection electrode 172 contacts the switching drain electrode 136a through the first drain contact hole 152a, and the other end of the gate connection electrode 172 contacts the gate auxiliary pattern 146 through the auxiliary pattern contact hole 153. Each of the pixel electrode 170 and the gate connection pattern 172 is formed of a transparent conductive material, for example, indium-tin-oxide (ITO) or indium-zinc-oxide (IZO).

In the above array substrate 101, since each of the switching and driving active layers 115a and 115b is formed of intrinsic polycrystalline silicon, a mobility property is improved. In addition, since each of the first switching gate electrode 105a and the first driving gate electrode 105b is formed of impurity-doped polycrystalline silicon or a metallic material having a melting point above about 800° C., the first switching gate electrode 105a and the first driving gate electrode 105b is not deformed during a crystallizing process for the switching and driving active layers 115a and 115b. As a result, a deformation of the substrate 101 is also prevented.

In addition, since a portion of the interlayer insulating layer 122 serves as an etch-stopper, a thickness of each of the switching and driving active layers 115a and 115b is uniform even if a dry-etching process is performed. Accordingly, degradation of properties of the switching and driving TFTs STr and DTr is prevented.

Furthermore, since each of the switching TFT STr and the driving TFT DTr has a dual type gate electrode, an I-V curve of each of the switching TFT STr and the driving TFT DTr has an improved characteristic. As a result, even if brightness is decreased by a thermal degradation in an organic electroluminescent diode, a brightness deviation is minimized.

In FIG. 5, the second switching gate electrode 148a overlaps the switching source electrode 133a and the switching drain electrode 136a and a space between the switching source electrode 133a and the switching drain electrode 136a and the second driving gate electrode 148b overlaps the driving source electrode 133b and the driving drain electrode 136b and a space between the driving source electrode 133b and the driving drain electrode 136b. However, there is no limitation in a position and an area of each of the second switching gate electrode 148a and the second driving gate electrode 148b.

FIGS. 6A to 6D are plane views showing a TFT of an array substrate for OELD device according to modified embodiments of the present invention, respectively. FIGS. 6A to 6D show a switching TFT. However, the structure in FIGS. 6A to 6D can be adopted to apply to a driving TFT. For ease of discussion, the elements are referenced without indicating switching or driving TFT through FIGS. 6A to 6D.

Figure 6A:
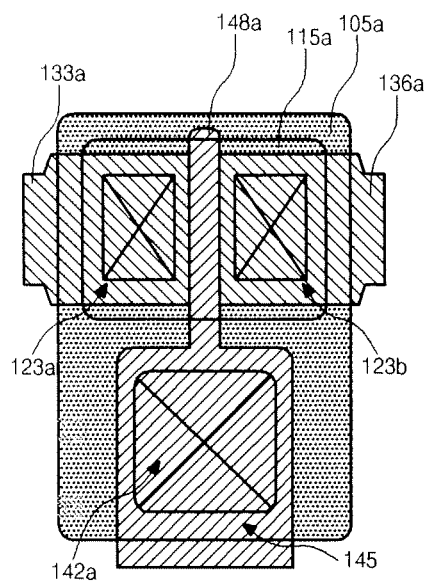
FIGS. 6A to 6D are plane views showing a TFT of an array substrate for OELD device according to modified embodiments of the present invention, respectively.
Figure 6B:
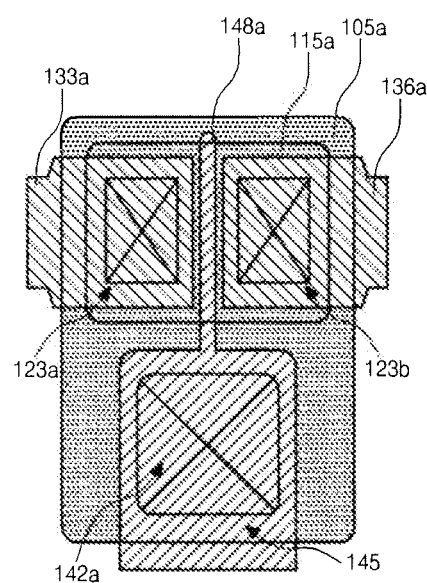

In FIG. 6A, the second gate electrode 148a as a top layer of the TFT completely overlaps only a channel of the active layer 115a. Namely, the second gate electrode 148a has a width equal to a distance between the source and drain electrodes 133a and 136a. In FIG. 6B, the second gate electrode 148a overlaps only a center of the channel of the active layer 115a. Namely, the second gate electrode 148a has a width smaller than a distance between the source and drain electrodes 133a and 136a.

Figure 6C:
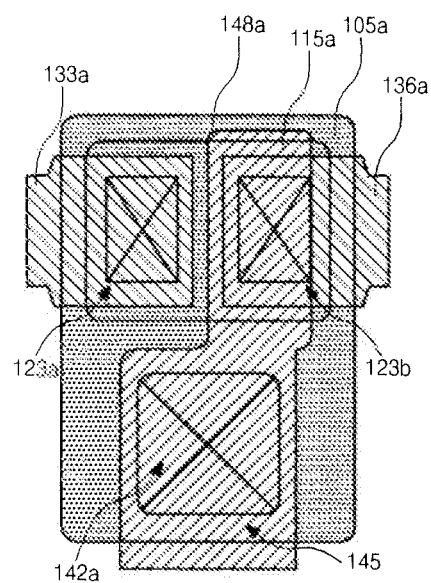
Figure 6D:
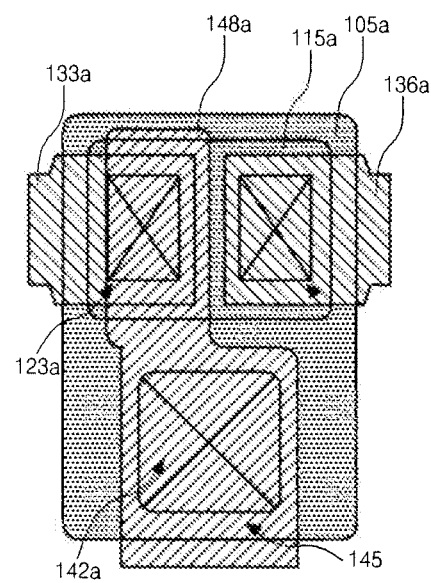

In FIG. 6C, the second gate electrode 148a overlaps only a portion of the channel of the active layer 115a and the drain electrode 136a. In FIG. 6D, the second gate electrode 148a overlaps only a portion of the channel of the active layer 115a and the source electrode 133a.

Based upon the position and are of the second gate electrode 148a in FIGS. 6A to 6D, an I-V curve of the TFT has an improved characteristic.

Figure 7A:
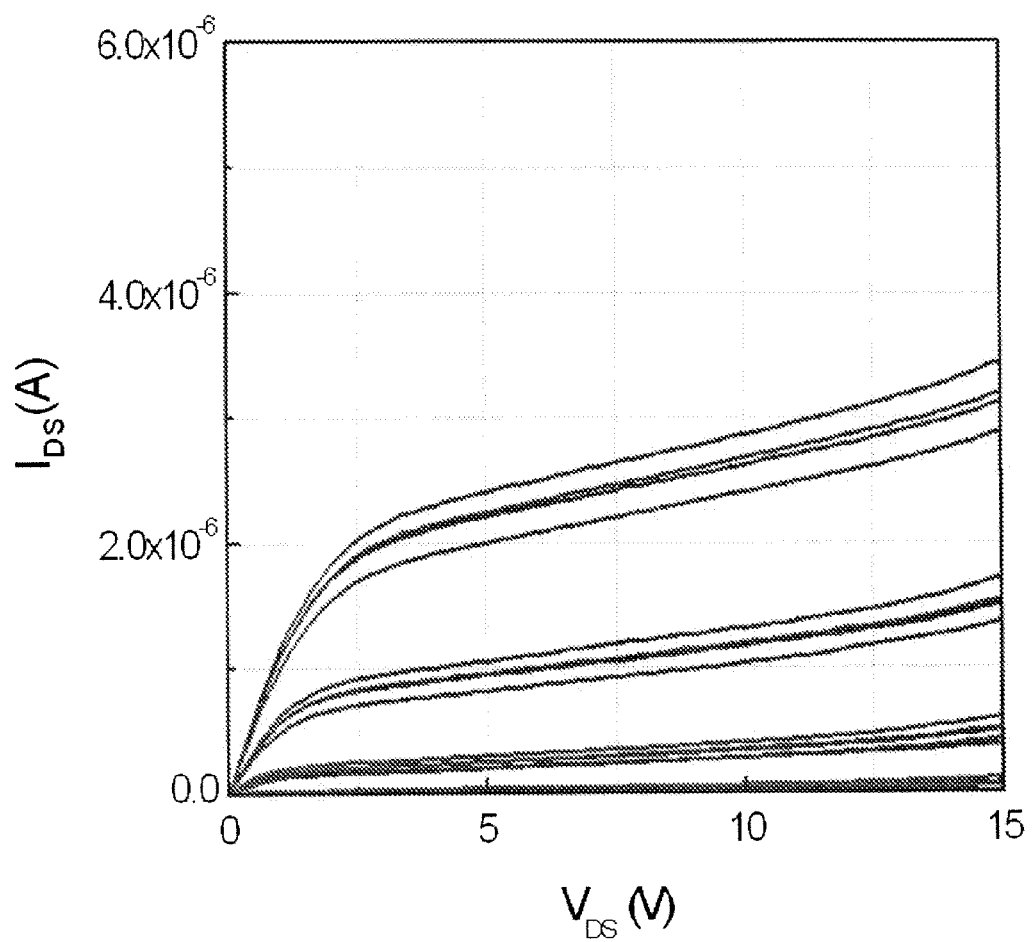
FIGS. 7A to 7E are I-V curve graphs of TFTs in FIG. 4 and FIGS. 6A to 6D, respectively.
Figure 7B:
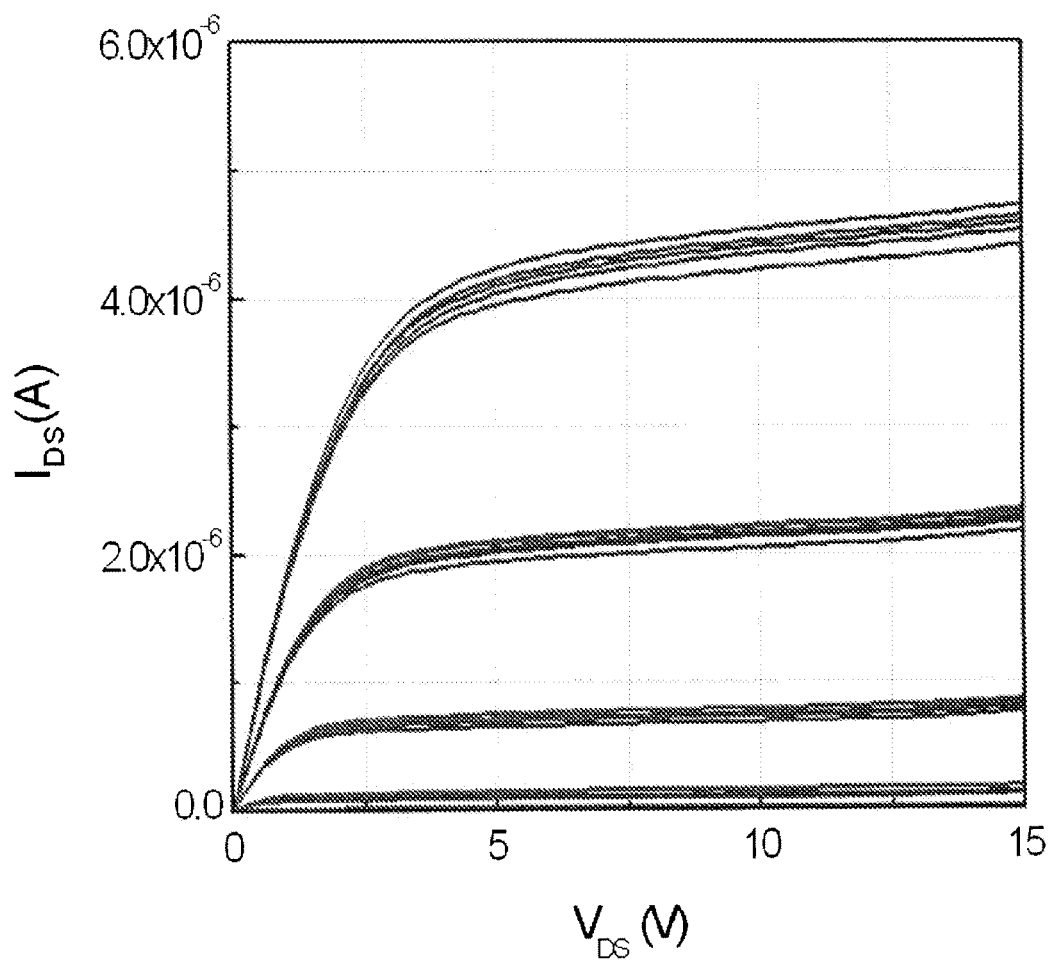
Figure 7C:
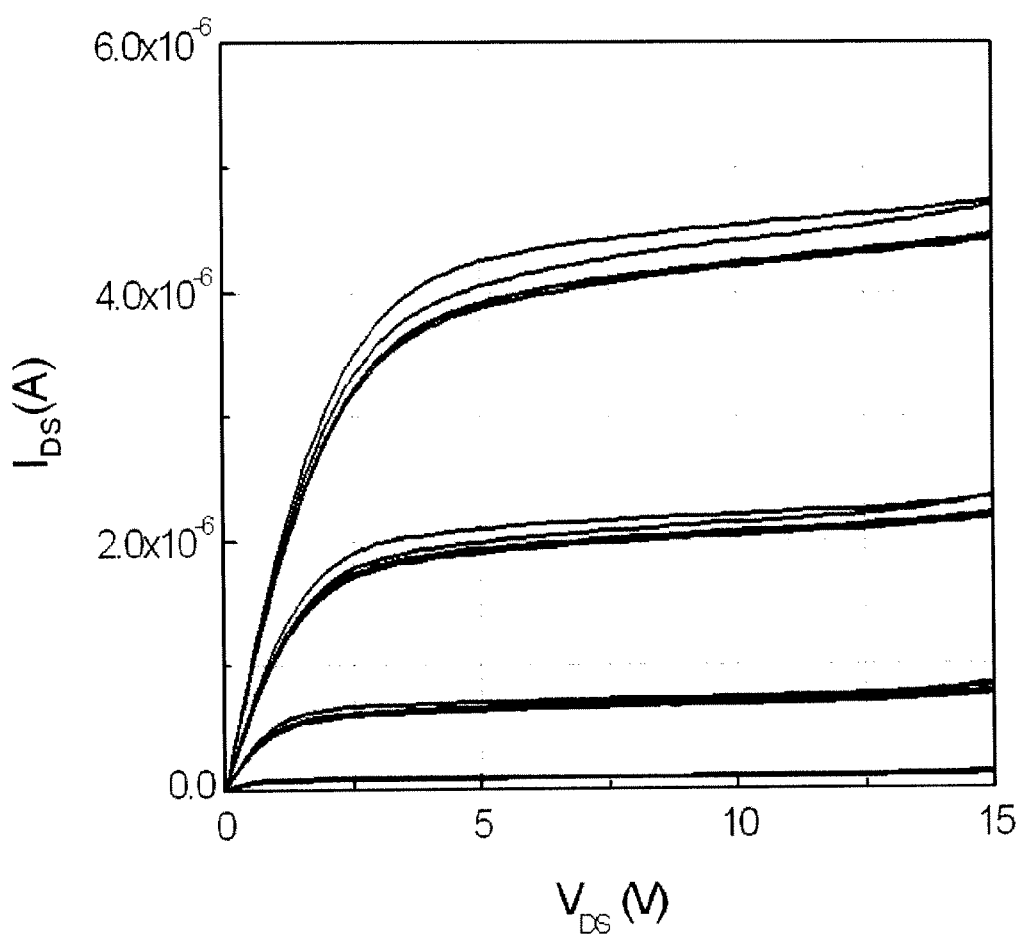
Figure 7D:
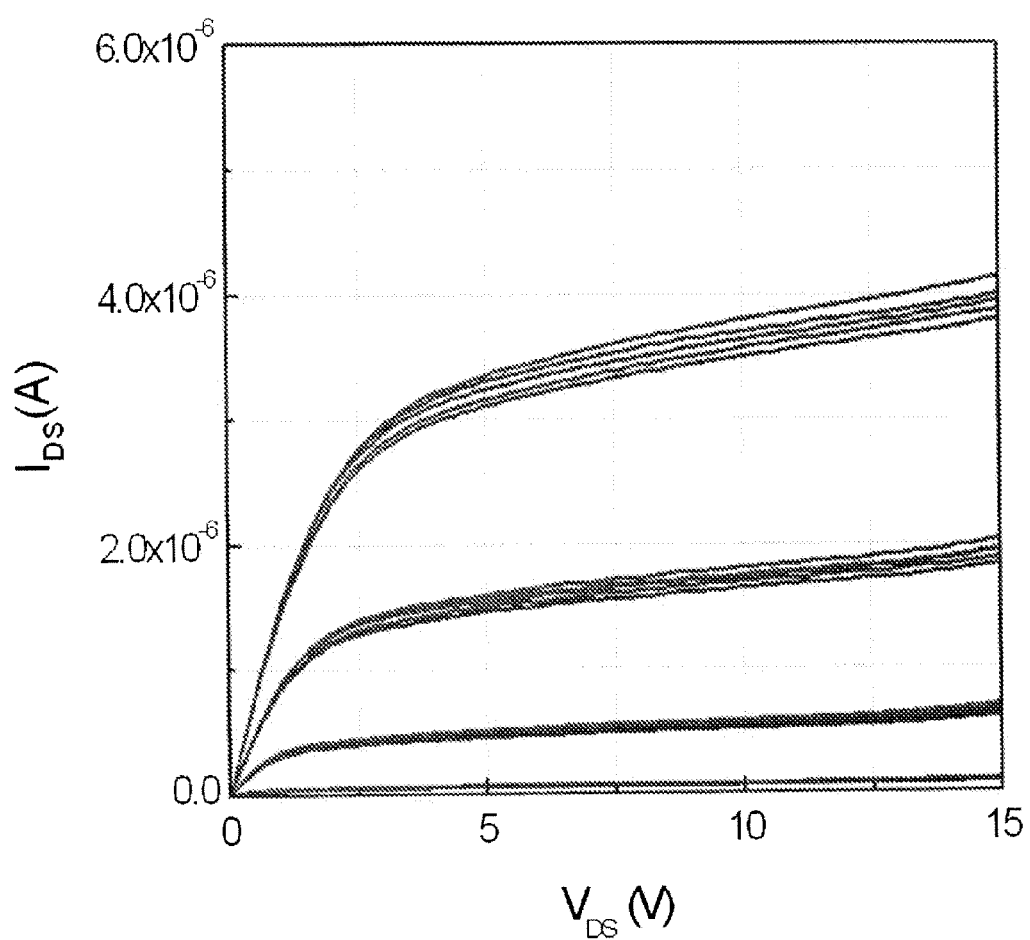
Figure 7E:
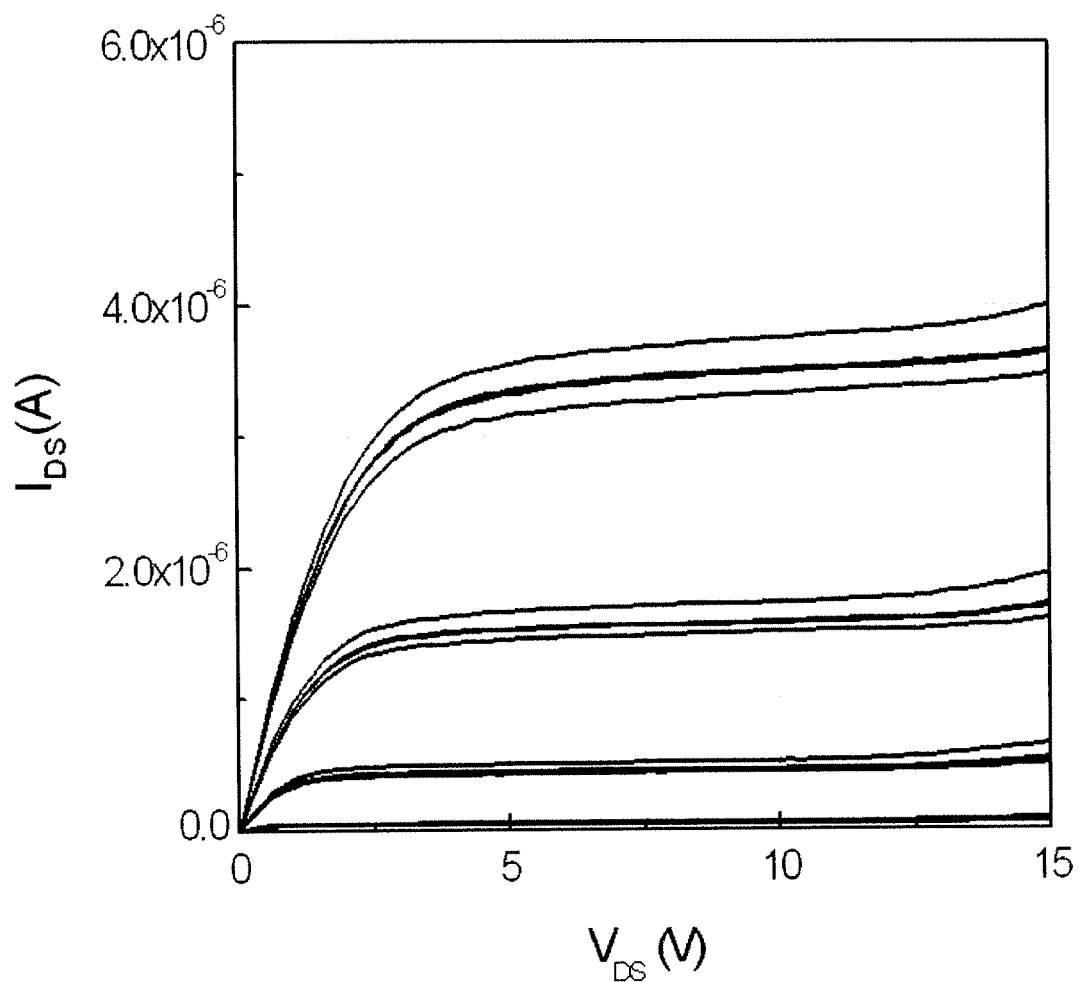

FIGS. 7A to 7E are I-V curve graphs of TFTs in FIG. 4 and FIGS. 6A to 6D, respectively. FIG. 7A shows an I-V curve graph of a TFT including a single gate electrode. FIG. 7B shows an I-V curve graph of a TFT including a dual type gate electrode one of which overlapping the channel and the source and drain electrodes. FIGS. 7C to 7E show an I-V curve graph of a TFT including a dual type gate electrode in FIGS. 6A to 6C, respectively. The I-V curve represents a source-drain current $I_{DS}$ according to a voltage difference $V_{DS}$ in the source and drain electrodes.

The I-V curve in FIGS. 7B to 7E is upwardly shifted in comparison to that in FIG. 7A. In particular, the current property of the TFT when turned on is improved. For example, in FIG. 7A, an uppermost curve has a source-drain current $I_{DS}$ of $2.0*10^{-6}$ A at a voltage difference $V_{DS}$ of 2.5V. On the other hand, an uppermost curve in FIGS. 7B to 7E has a source-drain current $I_{DS}$ of approximately $3.5*10^{-6}$ A, $3.5*10^{-6}$ A, $2.8*10^{-6}$ A, and $3.0*10^{-6}$ A, respectively, at a voltage difference $V_{DS}$ of 2.5V. In other words, an on-current property of the TFT is improved.

Ideally, when the voltage difference $V_{DS}$ is over a certain value, the curve should approach a constant value. In FIG. 7A, in a region of the voltage difference $V_{DS}$ over 2.5V, the curve has a value difference of about $1.5*10^{-6}$ A. In FIGS. 7B to 7E, in a region of the voltage difference $V_{DS}$ over 2.5V, the curve has a value difference of about $1.0*10^{-6}$ A. Namely, the curves in FIGS. 7B to 7E substantially approach a constant value.

Referring to FIGS. 4 and 5, a fabricating method is explained below.

First, the buffer layer 102 is formed on the substrate 101 by depositing an inorganic insulating material or coating an organic insulating material. For example, the inorganic insulating material includes silicon oxide or silicon nitride, and the organic insulating material includes photo-acryl or BCB. The buffer layer 102 has a thickness of about 1000 to about 5000 Å. When a crystallizing process is performed under a temperature of about 600° C. to about 800° C., an alkali ion can be diffused into polycrystalline silicon without the buffer layer 102 when the substrate 101 is directly exposed to the high temperature in the crystallizing process. The problem can be prevented by the buffer layer 102.

Next, a gate material layer (not shown), a first insulating material layer (not shown) and an intrinsic amorphous silicon layer (not shown) are sequentially formed on the buffer layer 102.

The gate material layer includes impurity-doped amorphous silicon. Alternatively, the gate material layer includes a metallic material having a high melting point greater than about 800° C. For example, the metallic material for the gate material layer includes one of titanium (Ti), tungsten (Tw), molybdenum alloy such as molybdenum-titanium alloy (MoTi), molybdenum (Mo), tantalum (Ta), copper (Cu), Cu alloy and combination thereof. When the gate material layer is formed of impurity-doped silicon, a thickness of the gate material layer is about 500 Å to about 1000 Å. When the gate material layer is formed of the above metallic material, a thickness of the gate material layer is about 100 Å to about 1000 Å, beneficially, about 100 Å to about 500 Å.

The first insulating material layer includes an inorganic insulating material or an organic insulating material. For example, the inorganic insulating material includes silicon oxide or silicon nitride, and the organic insulating material includes photo-acryl or BCB.

The intrinsic amorphous silicon layer has a thickness of about 300 Å to 1000 Å. In the related art array substrate, considering a thickness etched by a dry-etching process for an ohmic contact layer, the intrinsic amorphous silicon layer has a thickness over about 1000 Å. However, since a portion of the interlayer insulating layer 122 serves as an etch-stopper during the dry-etching process, a thickness of the intrinsic amorphous silicon layer is not reduced after the dry-etching process in the present disclosure. Accordingly, the intrinsic amorphous silicon layer of the present invention has a smaller thickness than that of the related art.

Next, a crystallizing process is performed to increase mobility in the channel such that the intrinsic amorphous silicon layer is crystallized into an intrinsic polycrystalline silicon layer (not shown). The crystallizing process may be a solid phase crystallization process or an excimer laser annealing process. For example, the solid phase crystallization process is a thermal crystallization process under a temperature of about 600° C. to about 800° C. or an alternating magnetic field crystallization process under a temperature of about 600° C. to 700° C.

When the gate material layer is formed of impurity-doped amorphous silicon, impurity-doped amorphous silicon is changed into impurity-doped polycrystalline silicon by the above crystallizing process. On the other hand, since the above metallic material for the gate material layer has a melting point above about 800° C., the gate material layer is not deformed by the crystallizing process. If the gate material layer is formed of a metallic material having a relatively low melting point i.e. below 800° C., the layer is deformed by the crystallizing process. However, the gate material layer is formed of impurity-doped amorphous silicon or the above metallic material having a melting point above about 800° C., there is no problem during the crystallizing process.

Next, the intrinsic polycrystalline silicon layer, the first insulating material layer and the gate material layer are patterned by a mask process to form the first switching gate electrode 105a from the gate material layer, the switching gate insulating layer 109a from the first insulating material layer, the first intrinsic polycrystalline silicon pattern (not shown) from the intrinsic polycrystalline silicon layer, the first driving gate electrode 105b from the gate material layer, the driving gate insulating layer 109b from the first insulating material layer, and the second intrinsic polycrystalline silicon pattern (not shown) from the intrinsic polycrystalline silicon layer. The mask process includes a step of coating a photoresist (PR) to form a PR layer, a step of exposing the PR layer using an exposing mask, a step of developing the PR layer to form a PR pattern, a step of etching a material layer using the PR pattern as an etching mask, and a step of stripping the PR pattern. The first switching gate electrode 105a, the switching gate insulating layer 109a and the first intrinsic polycrystalline silicon pattern are disposed in the switching region SA and have substantially the same plane shape and plane area as one another to perfectly overlap. The first driving gate electrode 105b, the driving gate insulating layer 109b and the second intrinsic polycrystalline silicon pattern are disposed in the driving region DA and have substantially the same plane shape and plane area as one another to perfectly overlap. A portion of the first driving gate electrode 105b is defined as the first storage electrode 106 in the storage region StgA.

Next, the first and second intrinsic polycrystalline silicon patterns are patterned to form the switching active layer 115a on the switching gate insulating layer 109a and in the switching region SA and the driving active layer 115b on the driving gate insulating layer 109b and in the driving region DA. In this case, a portion of the second intrinsic polycrystalline silicon pattern in the storage region StgA is removed to expose the first storage electrode 106.

Next, the interlayer insulating layer 122 is formed on the switching and active layers 115a and 115b. The interlayer insulating layer 122 includes an inorganic insulating material or an organic insulating material. For example, the inorganic insulating material includes silicon oxide or silicon nitride, and the organic insulating material includes photo-acryl or BCB. The interlayer insulating layer 122 is patterned to form the first to fourth active contact holes 123a, 123b, 123c and 123d. The first and second active contact holes 123a and 123b respectively expose both sides of the switching active layer 115a, and the third and fourth active contact holes 123c and 123d respectively expose both sides of the driving active layer 115b. A portion of the interlayer insulating layer 122 corresponding to a center of each of the switching and driving active layers 115a and 115b serves as an etch-stopper. Other portions of the interlayer insulating layer 122 serve as an insulating layer.

Next, an impurity-doped amorphous silicon layer (not shown) and a first metallic material layer (not shown) are sequentially formed on the interlayer insulating layer 122. The impurity-doped amorphous silicon layer is formed of impurity-doped amorphous silicon. The first metallic material layer having a single layer is shown. The first metallic material layer of the single layer is formed of one of Mo, Mo alloy, chromium (Cr), Cr alloy and MoTi. Alternatively, the first metallic material layer may has a double-layered structure or a triple-layered structure.

The first metallic material layer and the impurity-doped amorphous silicon layer are patterned to form the data line 130, the first and second switching ohmic contact layers 127a and 127b, the first and second driving ohmic contact layers 127c and 127d, the switching source electrode 133a, the switching drain electrode 136a, the driving source electrode 133b, the driving drain electrode 136b and the first power line 134. A dummy pattern (not shown) from the impurity-doped amorphous silicon layer is disposed under each of the data line 130 and the first power line 134.

The data line 130 extends along a direction. The first and second switching ohmic contact layers 127a and 127b are disposed in the switching region SA and contact the switching active layer 115a through the first and second active contact holes 123a and 123b, respectively. The first and second driving ohmic contact layers 127c and 127d are disposed in the driving region SA and contact the driving active layer 115b through the third and fourth active contact holes 123c and 123d, respectively.

The switching source electrode 133a, which is connected to the data line 130, is disposed on the first switching ohmic contact layer 127a, and the switching drain electrode 136a is disposed on the second switching ohmic contact layer 127b. The switching drain electrode 136a is spaced apart from the switching source electrode 133a. The driving source electrode 133b is disposed on the third driving ohmic contact layer 127c, and the driving drain electrode 136b is disposed on the second driving ohmic contact layer 127d. The driving drain electrode 136b is spaced apart from the driving source electrode 133b.

The first power line 134 is parallel to and spaced apart from the data line 130. A portion of the first power line 134 overlaps the first storage electrode 106 to define the second storage electrode 137. The first storage electrode 106, the second storage electrode 137 and the second gate insulating layer 109b and the interlayer insulating layer 122 constitute a storage capacitor StgC.

Although not shown, first to fourth barrier patterns of intrinsic amorphous silicon may be disposed under each of the first and second switching ohmic contact layers 127a and 127b and each of the first and second driving ohmic contact layers 127c and 127d. Namely, the first to fourth barrier patterns contact each of the switching and driving active layers 115a and 115b through the first to fourth active contact holes 123a, 123b, 123c and 123d, respectively. The first to fourth barrier patterns have substantially the same plane area and plane shape as the first and second switching ohmic contact layers 127a and 127b and the first and second driving ohmic contact layers 127c and 127d, respectively. An intrinsic amorphous silicon layer for the first to fourth barrier patterns is formed on the interlayer insulating layer 122 before the impurity-doped amorphous silicon for first and second switching ohmic contact layers 127a and 127b and the first and second driving ohmic contact layers 127c and 127d is formed. Then, the intrinsic amorphous silicon layer is patterned with the impurity-doped amorphous silicon layer and the first metallic material layer.

Intrinsic polycrystalline silicon has a stronger adhesive property with intrinsic amorphous silicon than impurity-doped amorphous silicon. Accordingly, by disposing the first to fourth barrier patterns of intrinsic amorphous silicon between the switching active layer 115a and each of the first and second switching ohmic contact layers 127a and 127b and between the driving active layer 115b and each of the first and second driving ohmic contact layers 127c and 127d, respectively, an adhesive property can be improved.

On the other hand, before forming the impurity-doped amorphous silicon layer or the intrinsic amorphous silicon layer for the first to fourth barrier patterns on the interlayer insulating layer 122, a cleaning process using a buffered oxide etchant (BOE) may be performed. It may be called as a BOE cleaning process. The intrinsic amorphous silicon layer for the switching and driving active layers 115a and 115b is directly exposed to the crystallizing process under a high temperature of 600. As a result, a thermal oxidation layer (not shown) is formed on a top surface of the switching and driving active layers 115a and 115b. For example, an ohmic contact property between the switching active layer 115a and each of the first and second switching ohmic contact layers 127a and 127b and between the driving active layer 115b and each of the first and second driving ohmic contact layers 127c and 127d is degraded by the thermal oxidation layer. Accordingly, the BOE cleaning process can be performed on the switching and driving active layers 115a and 115b to remove the thermal oxidation layer before the step of forming the impurity-doped amorphous silicon layer for the ohmic contact layers 127a, 127b, 127c and 127d or the intrinsic amorphous silicon layer for the first to fourth barrier patterns.

In the present invention, since a portion of the interlayer insulating layer 122 as the etch-stopper covers the center portion of each of the switching and driving active layers 115a and 115b, there is no damage on the switching and driving active layers 115a and 115b during a dry-etching process for the ohmic contact layers 127a, 127b, 127c and 127d. Namely, since the interlayer insulating layer 122 covers the center portion of each of the switching and driving active layers 115a and 115b during the dry-etching process for the ohmic contact layers 127a, 127b, 127c and 127d, the interlayer insulating layer 122 protects the switching and driving active layers 115a and 115b such that a thickness of each of the switching and driving active layers 115a and 115b is not reduced by the dry-etching process. Accordingly, each of switching and driving active layers 115a and 115b has an uniform thickness.

Next, the first passivation layer 140 is formed on the switching and driving source electrodes 133a and 133b, the switching and driving drain electrodes 136a and 136b, the second storage electrode 137, the first power line 134 and the data line 130 by depositing an inorganic insulating material or coating an organic insulating material. For example, the inorganic insulating material includes silicon oxide or silicon nitride, and the organic insulating material includes photo-acryl or BCB.

The first passivation layer 140, and the interlayer insulating layer 122 and the first gate insulating layer 109a under the first passivation layer 140 are patterned by a mask process to form the first gate contact hole 142a exposing a portion of the first switching gate electrode 105a. In addition, the first passivation layer 140, and the interlayer insulating layer 122 and the second gate insulating layer 109b under the first passivation layer 140 are patterned to form the second gate contact hole 142b exposing a portion of the first driving gate electrode 105b. In addition, a power contact hole 154 exposing the first power line 134 is formed through the first passivation layer 140.

Next, a second metallic material layer (not shown) is formed on the first passivation layer 140 including the first and second gate contact holes 142a and 142b, and the power contact hole 154 by depositing a second metallic material, for example, aluminum (Al), Al alloy such as AlNd, copper (Cu), Cu alloy, molybdenum (Mo),MO alloy, Ti, Ti alloy, chromium (Cr), Cr alloy or combination thereof. The second metallic material layer having a single layer is shown. Alternatively, the second metallic material layer may have a double-layered structure or a triple-layered structure. The second metallic material layer is patterned to form the gate line 145, the second switching gate electrode 148a, the second driving gate electrode 148b, the gate auxiliary pattern 146 and the second power line 147.

The gate line 145 contacts the first switching gate electrode 105 and crosses the data line 130. The second switching gate electrode 148a extends from the gate line 145. The second switching gate electrode 148a overlaps a space between the switching source electrode 133a and the switching drain electrode 136a. Namely, the second switching gate electrode 148a overlaps the channel of the switching active layer 115a. The gate auxiliary pattern 146 contacts the first driving gate electrode 105b through the second gate contact hole 142b. The second driving gate electrode 148b extends from the gate auxiliary pattern 146. The second driving gate electrode 148b overlaps a space between the driving source electrode 133b and the driving drain electrode 136b. Namely, the second driving gate electrode 148b overlaps the channel of the driving active layer 115b. The second power line 147 contacts the first power line 134 through the power contact hole 154. The second power line 147 is parallel to and spaced apart from the gate line 145. A position and a shape of each of the second switching gate electrode 148a and the second driving gate electrode 148b can be varied as shown in FIGS. 6A to 6D.

The first switching gate electrode 105a, the switching gate insulating layer 109a, the switching active layer 115a, the interlayer insulating layer 122, the first and second switching ohmic contact layers 127a and 127b, the switching source electrode 133a, the switching drain electrode 136a, the first passivation layer 140 and the second switching gate electrode 148a constitute the switching TFT STr. The first driving gate electrode 105b, the driving gate insulating layer 109b, the driving active layer 115b, the interlayer insulating layer 122, the first and second driving ohmic contact layers 127c and 127d, the driving source electrode 133b, the driving drain electrode 136b, the first passivation layer 140 and the second driving gate electrode 148b constitute the driving TFT DTr.

Next, the second passivation layer 150 is formed on the gate line 145, the second switching gate electrode 148a, the second driving gate electrode 148b, the gate auxiliary pattern 146 and the second power line 147. The second passivation layer 150 is formed of an inorganic insulating material or an organic insulating material. For example, the inorganic insulating material includes silicon oxide or silicon nitride, and the organic insulating material includes photo-acryl or BCB. The second passivation layer 150 and the first passivation layer 140 are patterned to form the first and second drain contact holes 152a and 152b exposing the switching drain electrode 136a and the driving drain electrode 136b, respectively. At the same time, the auxiliary pattern contact hole 153 is formed through the second passivation layer 150 to expose the gate auxiliary pattern 146.

Next, a transparent conductive material layer (not shown) is formed on the second passivation layer 150 by depositing a transparent conductive material, such as ITO and IZO, such that the array substrate according to the present invention is obtained. The transparent conductive material layer is patterned to form the connection electrode 172 for connecting the switching drain electrode 136a and the gate auxiliary pattern 146 and the pixel electrode 170. The pixel electrode 170 is connected to the driving drain electrode 136b through the second drain contact hole 152b. One end of the gate connection electrode 172 contacts the switching drain electrode 136a through the first drain contact hole 152a, and the other end of the gate connection electrode 172 contacts the gate auxiliary pattern 146 through the auxiliary pattern contact hole 153.

Although not shown, a bank is formed at boundaries of the pixel region P and on the pixel electrode 170. In addition, an organic luminescent layer is formed in the pixel region P, and a counter electrode is formed on the organic luminescent layer.

On the other hand, the array substrate for an LED device includes only the switching TFT. In this case, there is no power line, and the pixel electrode is connected to the drain electrode of the switching TFT.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a display device, comprising:
   a substrate having a pixel region, the pixel region including a switching region, a driving region and a storage region;
   a gate line, a data line and a power line on the substrate, the gate and data lines crossing each other to define the pixel region;
   a switching thin film transistor (TFT) on the substrate and arranged in the switching region, the switching TFT connected to the gate and data lines and including a first switching gate electrode, a switching gate insulating layer on the first switching gate electrode, a switching active layer of an intrinsic polycrystalline silicon on the switching gate insulating layer, an interlayer insulating layer on the active layer and including first and second active contact holes, which respectively expose both sides of the active layer, first and second switching ohmic contact layers contacting the switching active layer, a switching source electrode on the first switching ohmic contact layer, and a switching drain electrode on the second switching ohmic contact layer;
   a driving TFT on the substrate and arranged in the driving region, the driving TFT connected to the switching TFT and the power line and including a first driving gate electrode, a driving gate insulating layer on the first driving gate electrode, a driving active layer of intrinsic polycrystalline silicon on the driving gate insulating layer, first and second driving ohmic contact layers contacting the driving active layer, a driving source electrode on the first driving ohmic contact layer, and a driving drain electrode on the second driving ohmic contact layer; and
   a pixel electrode connected to the driving drain electrode and disposed in the pixel region,
   wherein the switching TFT further includes a second switching gate electrode over the switching active layer, and the first and second ohmic contact layers contact the active layer through the first and second active contact holes, respectively.

2. The substrate according to claim 1, wherein the driving TFT further includes a second driving gate electrode over the driving active layer.

3. The substrate according to claim 2, wherein the second driving gate electrode overlaps the driving source electrode, the driving drain electrode and a space between the driving source and drain electrodes.

4. The substrate according to claim 2, wherein the second driving gate electrode only overlaps a space between the driving source and drain electrodes.

5. The substrate according to claim 4, wherein the second driving gate electrode has a width being equal to or smaller than a distance between the driving source and drain electrodes.

6. The substrate according to claim 2, wherein the second driving gate electrode overlaps one of the driving source and drain electrodes and a space between the driving source and drain electrodes.

7. The substrate according to claim 1, further comprising a first passivation layer on a surface of the interlayer insulating layer including the switching source electrode, the switching drain electrode, the driving source electrode and the driving drain electrode formed thereon, wherein the first passivation layer, the interlayer insulating layer and the switching gate insulating layer includes a first gate contact hole exposing the first switching gate electrode of the switching TFT, and the gate line is disposed on the first passivation layer and contacts the first switching gate electrode of the switching TFT through the first gate contact hole.

8. The substrate according to claim 7, further comprising a second passivation layer on a surface of the first passivation layer including the gate line formed thereon, wherein the first and second passivation layer includes a first drain contact hole exposing the driving drain electrode, and the pixel electrode is disposed on the second passivation layer and contacts the driving drain electrode through the first drain contact hole.

9. The substrate according to claim 8, further comprising;
   a gate auxiliary pattern on the first passivation layer; and
   a connection electrode on the second passivation layer,
   wherein the first passivation layer and the driving gate insulating layer further includes a second gate contact hole exposing the first driving gate electrode of the driving TFT, the first and second passivation layer further include a second drain contact hole exposing the switching drain contact hole, and the second passivation layer further includes an auxiliary pattern contact hole exposing the gate auxiliary pattern, and wherein the gate auxiliary pattern contacts the first driving gate electrode of the driving TFT through the second gate contact hole, and the connection pattern contacts the switching drain electrode and the gate auxiliary pattern through the second drain contact hole and the auxiliary pattern contact hole, respectively.

10. The substrate according to claim 1, wherein each of the first switching and driving gate electrodes of the switching and driving TFTs includes impurity-doped polycrystalline silicon and has a thickness of about 500 to about 1000 Å.

11. The substrate according to claim 1, wherein each of the first switching and driving gate electrodes of the switching and driving TFTs includes a metallic material having a melting point above about 800 and has a thickness of about 100 to about 1000 Å.

12. The substrate according to claim 11, wherein the metallic material includes one of titanium (Ti), tungsten (Tw), molybdenum alloy such as molybdenum-titanium alloy (MoTi), molybdenum (Mo), tantalum (Ta), copper (Cu), Cu alloy and combination thereof.

13. The substrate according to claim 1, wherein the power line includes a first sub-power line parallel to the data line and a second sub-power line parallel to the gate line and connected to the first sub-power line, and wherein the driving source electrode extends form the first sub-power line.

14. The substrate according to claim 1, wherein the second switching gate electrode overlaps the switching source electrode, the switching drain electrode and a space between the switching source and drain electrodes.

15. The substrate according to claim 1, wherein the second switching gate electrode only overlaps a space between the switching source and drain electrodes.

16. The substrate according to claim 15, wherein the second switching gate electrode has a width being equal to or smaller than a distance between the switching source and drain electrodes.

17. The substrate according to claim 1, wherein the second switching gate electrode overlaps one of the switching source and drain electrodes and a space between the switching source and drain electrodes.

18. The substrate according to claim 1, further comprising a buffer layer directly on the substrate and includes an inorganic insulating material or an organic insulating material.

19. The substrate according to claim 1, wherein the first driving gate electrode of the driving TFT extends into the storage region to form a first storage electrode, and a portion of the power line overlaps the first storage electrode to form a storage capacitor.

20. The substrate according to claim 1, further comprising first to fourth barrier patterns between each of the first and second switching ohmic contact layers and the switching active layer and between each of the first and second driving ohmic contact layers and the driving active layer, respectively, wherein each of the first to fourth barrier pattern is formed of intrinsic amorphous silicon, and each of the first and second switching ohmic contact layers and the first and second driving ohmic contact layers is formed of impurity-doped amorphous silicon.

21. An array substrate for a display device, comprising:
gate and data lines on a substrate including a pixel region and crossing each other to define the pixel region;
a thin film transistor (TFT) on the substrate and connected to the gate and data lines, the TFT including a first gate electrode, a gate insulating layer on the first gate electrode, an active layer of intrinsic polycrystalline silicon on the gate insulating layer, an interlayer insulating layer on the active layer and including first and second active contact holes, which respectively expose both sides of the active layer, first and second ohmic contact layers contacting the active layer, a source electrode on the first ohmic contact layer, a drain electrode on the second ohmic contact layer, and a second gate electrode over the active layer; and
a pixel electrode connected to the drain electrode and disposed in the pixel region,
wherein the first and second ohmic contact layers contact the active layer through the first and second active contact holes, respectively.

22. The substrate according to claim 21, further comprising a first passivation layer on a surface of the interlayer insulating layer including the source electrode and the drain electrode formed thereon, wherein the first passivation layer, the interlayer insulating layer and the gate insulating layer includes a gate contact hole exposing the first gate electrode, and the gate line is disposed on the first passivation layer and contacts the first gate electrode through the first gate contact hole.

23. The substrate according to claim 22, further comprising a second passivation layer on a surface of the first passivation layer including the gate line formed thereon, wherein the first and second passivation layer includes a drain contact hole exposing the drain electrode, and the pixel electrode is disposed on the second passivation layer and contacts the drain electrode through the drain contact hole.

24. The substrate according to claim 21, wherein the first gate electrodes of the TFT includes impurity-doped polycrystalline silicon and has a thickness of about 500 to about 1000 Å.

25. The substrate according to claim 21, wherein the first gate electrodes of the TFT includes a metallic material having a melting point above about 800 and has a thickness of about 100 to about 1000 Å.

26. The substrate according to claim 25, wherein the metallic material includes one of titanium (Ti), tungsten (Tw), molybdenum alloy such as molybdenum-titanium alloy (MoTi), molybdenum (Mo), tantalum (Ta), copper (Cu), Cu alloy and combination thereof.

27. The substrate according to claim 21, wherein the second gate electrode overlaps the source electrode, the drain electrode and a space between the source and drain electrodes.

28. The substrate according to claim 21, wherein the second gate electrode only overlaps a space between the source and drain electrodes.

29. The substrate according to claim 28, wherein the second gate electrode has a width being equal to or smaller than a distance between the source and drain electrodes.

30. The substrate according to claim 21, wherein the second gate electrode overlaps one of the source and drain electrodes and a space of between the source and drain electrode.

31. The substrate according to claim 21, further comprising a buffer layer directly on the substrate and includes an inorganic insulating material or an organic insulating material.

32. The substrate according to claim 21, further comprising first and second barrier patterns between each of the first and second ohmic contact layers and the active layer, respectively, wherein each of the first and second barrier pattern is formed of intrinsic amorphous silicon, and each of the first and second ohmic contact layers is formed of impurity-doped amorphous silicon.

33. An array substrate for a display device, comprising:
a substrate having a pixel region, the pixel region including a switching region, a driving region and a storage region;

a gate line, a data line and a power line on the substrate, the gate and data lines crossing each other to define the pixel region;

a switching thin film transistor (TFT) on the substrate and arranged in the switching region, the switching TFT connected to the gate and data lines and including a first switching gate electrode, a switching gate insulating layer on the first switching gate electrode, a switching active layer of an intrinsic polycrystalline silicon on the switching gate insulating layer, first and second switching ohmic contact layers contacting the switching active layer, a switching source electrode on the first switching ohmic contact layer, and a switching drain electrode on the second switching ohmic contact layer;

a driving TFT on the substrate and arranged in the driving region, the driving TFT connected to the switching TFT and the power line and including a first driving gate electrode, a driving gate insulating layer on the first driving gate electrode, a driving active layer of intrinsic polycrystalline silicon on the driving gate insulating layer, first and second driving ohmic contact layers contacting the driving active layer, a driving source electrode on the first driving ohmic contact layer, and a driving drain electrode on the second driving ohmic contact layer; and a pixel electrode connected to the driving drain electrode and disposed in the pixel region, wherein the switching TFT further includes a second switching gate electrode over the switching active layer, and the second switching gate electrode is disposed at the same layer as and extends from the gate line.

34. An array substrate for a display device, comprising:

gate and data lines on a substrate including a pixel region and crossing each other to define the pixel region;

a thin film transistor (TFT) on the substrate and connected to the gate and data lines, the TFT including a first gate electrode, a gate insulating layer on the first gate electrode, an active layer of intrinsic polycrystalline silicon on the gate insulating layer, first and second ohmic contact layers contacting the active layer, a source electrode on the first ohmic contact layer, a drain electrode on the second ohmic contact layer, and a second gate electrode over the active layer; and a pixel electrode connected to the drain electrode and disposed in the pixel region, wherein the second gate electrode is disposed at the same layer as and extends from the gate line.

* * * * *